(12) United States Patent
Yu

(10) Patent No.: US 6,743,680 B1
(45) Date of Patent: *Jun. 1, 2004

(54) PROCESS FOR MANUFACTURING TRANSISTORS HAVING SILICON/GERMANIUM CHANNEL REGIONS

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/599,141

(22) Filed: Jun. 22, 2000

(51) Int. Cl.[7] .............................................. H01L 21/336
(52) U.S. Cl. ...................... 438/285; 438/166; 438/301; 438/308; 438/933
(58) Field of Search .................. 438/166, 285, 438/308, 433, 282, 662, 795

(56) References Cited

U.S. PATENT DOCUMENTS

| | | | |
|---|---|---|---|
| 4,046,618 A | * 9/1977 | Chaudhari et al. ............ 117/8 |
| 4,174,521 A | 11/1979 | Neale | |
| 4,272,880 A | 6/1981 | Pashley | |
| 4,381,201 A | 4/1983 | Sakurai | |
| 4,697,333 A | 10/1987 | Nakahara | |
| 4,710,478 A | * 12/1987 | Yoder et al. ................ 257/192 |
| 4,849,033 A | * 7/1989 | Vander Sande et al. .... 136/239 |
| 4,975,387 A | * 12/1990 | Prokes et al. .................. 117/8 |
| 4,994,866 A | * 2/1991 | Awano ........................ 357/16 |
| 4,996,574 A | 2/1991 | Shirasaki | |
| 5,008,211 A | * 4/1991 | Yamazaki .......... 148/DIG. 160 |
| 5,019,882 A | * 5/1991 | Solomon et al. ........... 357/23.8 |
| 5,036,374 A | * 7/1991 | Shimbo ...................... 257/192 |
| 5,041,884 A | 8/1991 | Kumamoto et al. | |
| 5,114,876 A | * 5/1992 | Weiner ........................ 117/53 |
| 5,128,732 A | 7/1992 | Sugahara et al. | |
| 5,155,571 A | * 10/1992 | Wang et al. ................... 357/42 |
| 5,321,286 A | 6/1994 | Koyama et al. | |
| 5,346,834 A | 9/1994 | Hisamoto et al. | |
| 5,414,288 A | 5/1995 | Fitch et al. | |

(List continued on next page.)

FOREIGN PATENT DOCUMENTS

| | | | |
|---|---|---|---|
| EP | 0 334 682 A2 | 3/1989 | |
| JP | 61-180466 | 8/1986 | |
| JP | 0 334 682 A2 * | 3/1989 | .......... H01L/29/72 |
| JP | 3-288471 | 12/1991 | |
| JP | 5-335482 | 12/1993 | |

OTHER PUBLICATIONS

"Smart–Cut: The Basic Fabrication Process for UNIBOND Soi Wafers" Herve, et al., Mar. 3, 1997.

"Sub–100nm Gate Length Metal NMOS Transistors Fabricated by a Replacement Gate Process" By Chatterjee, Dec. 7–10, 1997 IEEE.

U.S. patent application Ser. No. 09/599,270 entitled "A Solid Phase Epitaxy Process for Manufacturing Transistor Shaving Silicon/Germanium Channel Regions " by Yu on Jun. 22, 2000. (Atty. Dkt. No. 39153–268).

U.S. patent application Ser. No. 09/817,580 entitled "Method of Locally Forming A Silicone/Germanium Channel Layer" by Yu on Mar. 26, 2001 (Atty. Dkt. No. 39153–428).

Primary Examiner—John F. Niebling
Assistant Examiner—Angel Roman
(74) Attorney, Agent, or Firm—Foley & Lardner LLP

(57) ABSTRACT

A method of manufacturing an integrated circuit includes providing an amorphous semiconductor material including germanium, annealing the amorphous semiconductor material, and doping to form a source location and a drain location. The semiconductor material containing germanium can increase the charge mobility associated with the transistor.

27 Claims, 2 Drawing Sheets

U.S. PATENT DOCUMENTS

| Patent | | Date | Inventor | Ref |
|---|---|---|---|---|
| 5,420,048 | A | 5/1995 | Kondo | |
| 5,451,798 | A | 9/1995 | Tsuda et al. | |
| 5,461,250 | A | 10/1995 | Burghartz et al. | |
| 5,482,877 | A | 1/1996 | Rhee | |
| 5,497,018 | A | 3/1996 | Kajita | |
| 5,554,870 | A | 9/1996 | Fitch et al. | |
| 5,581,101 | A | 12/1996 | Ning et al. | |
| 5,591,653 | A | 1/1997 | Sameshima et al. | |
| 5,612,552 | A | 3/1997 | Owens | |
| 5,675,185 | A | 10/1997 | Chen et al. | |
| 5,683,934 | A * | 11/1997 | Candelaria | 437/134 |
| 5,689,136 | A | 11/1997 | Usami et al. | |
| 5,753,541 | A | 5/1998 | Shimizu | |
| 5,753,542 | A * | 5/1998 | Yamazaki et al. | 438/162 |
| 5,766,989 | A * | 6/1998 | Maegawa et al. | 438/166 |
| 5,821,149 | A * | 10/1998 | Schuppen et al. | 438/312 |
| 5,856,225 | A | 1/1999 | Lee et al. | |
| 5,906,951 | A * | 5/1999 | Chu et al. | 438/751 |
| 5,910,015 | A | 6/1999 | Sameshima et al. | |
| 5,936,280 | A | 8/1999 | Liu | |
| 5,981,345 | A | 11/1999 | Ryum et al. | |
| 5,985,703 | A * | 11/1999 | Banerjee | 438/162 |
| 6,022,785 | A | 2/2000 | Yeh et al. | |
| 6,031,269 | A | 2/2000 | Liu | |
| 6,130,144 | A | 10/2000 | Verret | |
| 6,133,082 | A | 10/2000 | Masuoka | |
| 6,172,381 | B1 | 1/2001 | Gardner et al. | |
| 6,190,975 | B1 * | 2/2001 | Kubo et al. | 438/199 |
| 6,232,622 | B1 * | 5/2001 | Hamada | 257/67 |
| 6,268,640 | B1 | 7/2001 | Park et al. | |
| 6,310,367 | B1 | 10/2001 | Yagishita et al. | |
| 6,319,799 | B1 * | 11/2001 | Ouyang et al. | 257/192 |
| 6,350,311 | B1 * | 2/2002 | Chin et al. | 117/3 |
| 6,461,945 | B1 * | 10/2002 | Yu | 438/510 |

* cited by examiner

PROCESS FOR MANUFACTURING TRANSISTORS HAVING SILICON/GERMANIUM CHANNEL REGIONS

CROSS REFERENCE TO RELATED APPLICATIONS

The present application entitled, "A Process For Manufacturing Transistors Having Silicon/Germanium Channel Regions," is related to U.S. application Ser. No. 09/599,270, filed on an even date herewith by Yu.

BACKGROUND OF THE INVENTION

The present invention relates generally to integrated circuits (ICs) and methods of manufacturing integrated circuits. More particularly, the present invention relates to a method of manufacturing integrated circuits having transistors with specialized channel regions.

Integrated circuits (ICs), such as, ultra-large scale integrated (ULSI) circuits, can include as many as one million transistors or more. The ULSI circuit can include complementary metal oxide semiconductor (CMOS) field effect transistors (FETS). The transistors can include semiconductor gates disposed above a channel region and between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-inducted barrier-lowering. Shallow source and drain extensions and, hence, controlling short-channel effects, are particularly important as transistors become smaller.

Conventional techniques utilize a double implant process to form shallow source and drain extensions. According to the conventional process, the source and drain extensions are formed by providing a transistor gate structure without sidewall spacers on a top surface of a silicon substrate. The silicon substrate is doped on both sides of the gate structure via a conventional doping process, such as, a diffusion process or an ion implantation process. Without the sidewall spacers, the doping process introduces dopants into a thin region just below the top surface of the substrate to form the drain and source extensions as well as to partially form the drain and source regions.

After the drain and source extensions are formed, silicon dioxide spacers, which abut lateral sides of the gate structure, are provided over the source and drain extensions. With the silicon dioxide spacers in place, the substrate is doped a second time to form deep source and drain regions. During formation of the deep source and drain regions, further doping of the source and drain extensions is inhibited due to the blocking characteristic of the silicon dioxide spacers. The deep source and drain regions are necessary to provide sufficient material to connect contacts to the source and drain regions.

As transistors become smaller, it is desirous to increase the charge carrier mobility in the channel region. Increasing charge carrier mobility increases the switching speed of the transistor. Channel regions formed from materials other than silicon have been proposed to increase charge carrier mobility. For example, conventional thin film transistors which typically utilize polysilicon channel regions have been formed on a silicon germanium (Si—Ge) epitaxial layer above a glass (SiO$_2$) substrate. The Si—Ge epitaxial layer can be formed by a technique in which a semiconductor thin film, such as, an amorphous silicon hydride (a-Si:H), an amorphous germanium hydride (a-Ge:H) or the like is melted and crystallized by the irradiation of pulse laser beams.

In a bulk type device, such as, a metal oxide semiconductor field effect transistor (MOSFET), the use of Si—Ge materials could be used to increase charge carrier mobility, especially hole type carriers. A channel region containing germanium can have carrier mobility 2–5 times greater than a conventional Si channel region due to reduced carrier scattering and due to the reduced mass of holes in the germanium-containing material. According to conventional Si—Ge formation techniques for bulk-type devices, a dopant implanted molecular beam epitaxy (MBE) technique forms a Si—Ge epitaxial layer. However, the MBE technique requires very complicated, very expensive equipment and is not feasible for mass production of ICs.

Thus, there is a need for an integrated circuit or electronic device that includes channel regions with higher channel mobility. Further still, there is a need for transistors with a thin Si—Ge channel region and deep source and drain regions. Even further still, there is a need for a method of manufacturing a transistor having a thin Si—Ge channel region on a bulk-type semiconductor substrate.

SUMMARY OF THE INVENTION

An exemplary embodiment relates to a method of manufacturing an integrated circuit. The method includes providing an amorphous semiconductor material, annealing the amorphous semiconductor material, and doping to form source and drain regions. The amorphous semiconductor material contains germanium and is provided above a bulk substrate of semiconductor material. Excimer laser annealing the amorphous semiconductor material forms a single crystalline semiconductor layer containing germanium. The source and drain regions can be formed by doping the single crystalline semiconductor layer and the substrate at a source location and a drain location. A channel region between the source region and the drain region includes a thin semiconductor germanium region.

Another exemplary embodiment relates to a method of manufacturing an ultra-large scale integrated circuit including a transistor. The method includes steps of depositing a silicon germanium material above a top surface of a semiconductor substrate, annealing the silicon germanium material, depositing a silicon material above the silicon germanium material, annealing the silicon material, and providing a source region and a drain region for the transistor. The source region and the drain region are deeper than a combined thickness of the silicon germanium material and the silicon material.

Still another embodiment relates to a process of forming a transistor with a silicon germanium channel region. The process includes depositing a thin amorphous silicon germanium material, annealing the silicon germanium material, depositing a thin amorphous silicon material, annealing the silicon material, and providing a source region and a drain region for the transistor. The thin amorphous silicon germanium material is provided above a top surface of a semiconductor substrate. Annealing the silicon germanium material forms single crystalline silicon germanium material. The thin amorphous silicon material is provided above the single crystalline silicon germanium material. Annealing the silicon material forms single crystalline silicon material. The source and drain region extend into the substrate.

Yet another embodiment relates to a transistor. The transistor includes source and drain regions disposed in a bulk semiconductor substrate. The transistor also includes a silicon-germanium channel region between the source and drain regions.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
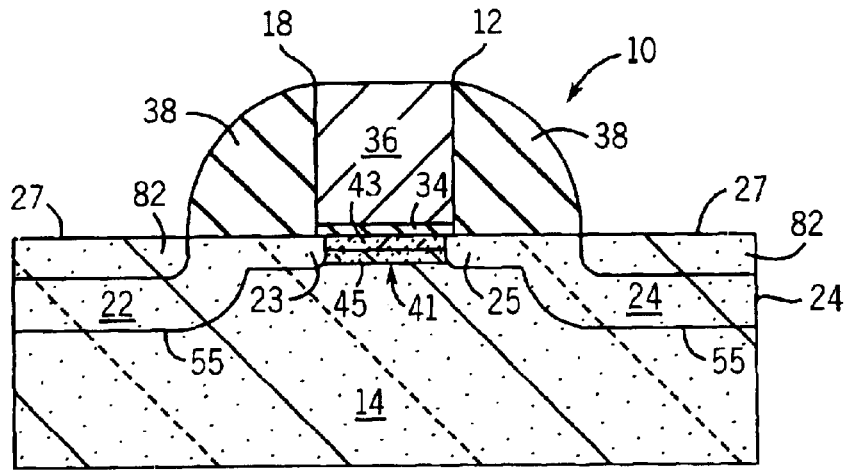
FIG. 1 is a cross-sectional view of a portion of an integrated circuit in accordance with an exemplary embodiment, the integrated circuit including a transistor provided on a semiconductor substrate, the transistor having a channel region which includes a semiconductor and germanium material.

With reference to FIG. 1, a portion 10 of an integrated circuit (IC) includes a transistor 12 which is disposed on a semiconductor substrate 14, such as, a wafer. Semiconductor substrate 14 is preferably a bulk P-type single crystalline (001) silicon substrate. Alternatively, substrate 14 can be an N-type well in a P-type substrate, or a semiconductor-on-insulator (SOI) substrate, (preferably silicon-on-glass) or other suitable material for transistor 12.

Transistor 12 can be a P-channel or N-channel metal oxide semiconductor field effect transistor (MOSFET). Transistor 12 includes a gate structure 18, a source region 22, and a drain region 24. Regions 22 and 24 extend from a top surface 27 of portion 10 to a bottom 55 in substrate 14. Regions 22 and 24 are preferably 50 nanometers (nm)–120 nm thick from surface 27 to bottom 55 (junction depth) and include a source extension 23 and a drain extension 25. For an N-channel transistor, regions 22 and 24 are heavily doped with N-type dopants (e.g., $5 \times 10^{19}$–$1 \times 10^{20}$ dopants per cubic centimeter). For a P-channel transistor, regions 22 and 24 are heavily doped with P-type dopants (e.g., $5 \times 10^{19}$–$1 \times 10^{20}$ dopants per cubic centimeter).

Extensions 23 and 25 are preferably shallow extensions (e.g., junction depth is less than 50 nm (15–40 nm)), which are thinner than regions 22 and 24. Extensions 23 and 25 are connected to regions 22 and 24, respectively, and are disposed partially underneath gate structure 18. Extensions 23 and 25 can be ultra-shallow to help transistor 12 achieve substantial immunity to short-channel effects. Short-channel effects can degrade performance of transistor 12 as well as the manufacturability of the IC associated with transistor 12.

Regions 22 and 24 and extensions 23 and 25 have a concentration of $10^{19}$ to $10^{20}$ dopants per cubic centimeter. An appropriate dopant for a P-channel transistor is boron, boron diflouride, or iridium, and an appropriate dopant for an N-channel transistor is arsenic, phosphorous, or antimony.

Gate stack or structure 18 includes a gate dielectric layer 34 and a gate conductor 36. Dielectric layer 34 is preferably comprised of a thermally grown, 15–25 Å thick silicon dioxide material. Alternatively, deposited silicon dioxide, nitride ($Si_3N_4$) material, or high K gate dielectric materials can be utilized.

Gate structure 18 can also include a pair of spacers 38. Spacers 38 can be manufactured in a conventional deposition and etch back process. Preferably, spacers 38 are manufactured from silicon dioxide and are 800–1200 Å in height (thick) and 500–1000 Å wide. Alternatively, other insulative material such as nitride can be utilized to form spacers 38.

Conductor 36 is preferably deposited as polysilicon by chemical vapor deposition (CVD) and etched to form the particular structure for transistor 12. Conductor 36 is preferably doped polysilicon. Alternatively, conductor 36 can be metal, such as a refractory metal, or include germanium to adjust the work function of transistor 12. Gate structure 18 has a height or thickness of 800–1200 Å.

Gate structure 18 is disposed over a channel region 41. Channel region 41 is specialized to have increased charge carrier mobility. Channel region 41 has a width slightly less than the gate length (e.g., 35 nm–100 nm) and advantageously includes a semiconductor containing germanium. Channel region 41 can include a thin silicon cap layer 43 and a thin silicon germanium layer 45. Alternatively, semiconductor material other than silicon can be utilized in layers 43 and 45. Thus, channel region 41 is comprised of a compound structure including layers 43 and 45. Layer 43 advantageously protects the integrity of layer 34 from the effects of germanium in layer 45. Thus, layer 43 can serve as a cap layer or protection layer above layer 45.

In a preferred embodiment, layer 45 is 200–500 Å thick, and layer 43 is 100–150 Å thick. Therefore, layer 45 is located from 100–150 Å below top surface 27 of portion 10. Region 41 is preferably less than 60 percent of the depth of regions 22 and 24.

Channel region 41 including layers 43 and 45 is preferably almost as deep as extensions 23 and 25. Channel region 41 is significantly shallower than the deep regions (contact locations) associated with source region 22 and drain region 24. Accordingly, sufficient depth is available for making contact to source region 22 and drain region 24 and yet a thin channel region 41 including silicon germanium layer 45 is attained. The use of layer 45 including germanium allows the mobility of carriers to be approximately 2–5 times larger than a channel region 41 comprised solely of silicon material.

The interface between layer 45 and substrate 14 is preferably extremely sharp in the vertical direction. An ideal design has a very clearly defined border between layer 45 and substrate 14. The mechanical stress associated with layer 45 increases mobility for channel 31 (e.g., stress-enhanced mobility).

A silicide layer, such as, regions 82, can be formed in regions 22 and 24. Regions 82 can be deposited or sputtered on top of source region 22 and drain region 24 for connection to contacts. Metal contacts can be coupled to regions 22 and 24 via regions 82. Conventional metal silicidation techniques can be utilized. For example, titanium silicide, cobalt silicide, tungsten silicide, and other silicides can be utilized.

Siliciding regions 22 and 24 to form regions 82 can consume the portion of regions 22 and 24 that includes germanium (associated with layer 45). Thus, the performance of regions 22 and 24 is not adversely impacted by the presence of germanium.

With reference to FIGS. 1–6, the fabrication of transistor 12, including channel region 41, is described below as follows. The advantageous process allows channel region 41 to include germanium and yet does not require MBE equipment. The process also allows deep source and drain regions 22 and 24 to be formed and yet allows a thin germanium silicon channel region 41 to be formed.

Figure 2:
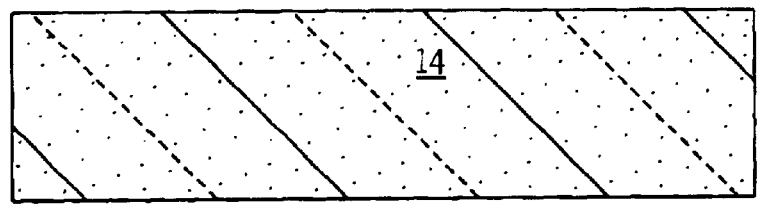
FIG. 2 is a cross-sectional view of the portion of the semiconductor substrate illustrated in FIG. 1.

In FIG. 2, a single crystalline bulk semiconductor substrate 14 is provided. Substrate 14 can be provided as part of a semiconductor wafer. Substrate 14 is preferably several hundred microns thick (for an eight inch wafer).

Figure 3:
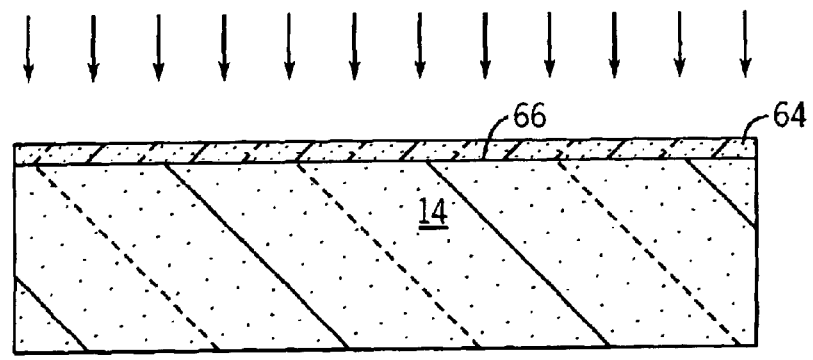
FIG. 3 is a cross-sectional view of the portion of the semiconductor substrate illustrated in FIG. 2, showing a semiconductor-germanium deposition step.

In FIG. 3, low pressure chemical vapor deposition (LPCVD) is utilized to deposit or provide a very thin amorphous semiconductor germanium layer such as an amorphous silicon germanium layer 64 on a top surface 66 of substrate 14. Preferably, layer 64 is deposited as a 200–500 Å thick amorphous silicon germanium layer at a temperature of 400–450° C.

Figure 4:
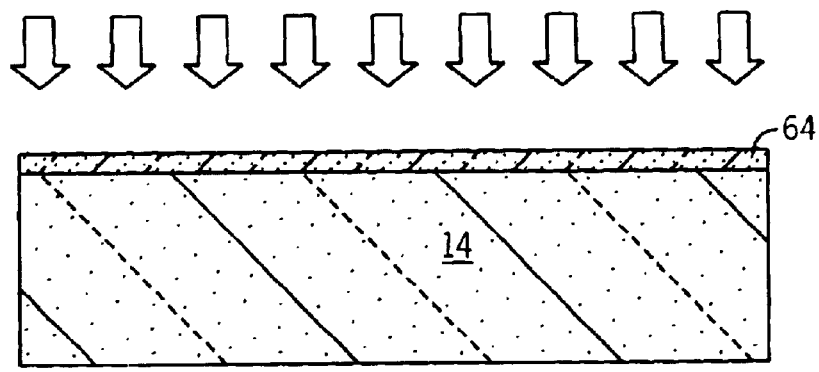
FIG. 4 is a cross-sectional view of the portion of the semiconductor substrate illustrated in FIG. 3, showing a laser annealing step.

In FIG. 4, after layer 64 is deposited, layer 64 is subjected to an annealing process. The annealing process changes the structure of layer 64 from an amorphous state to a single crystalline state (e.g., melts layer 64 which subsequently recrystalizes). Preferably, the annealing process is an excimer laser process (e.g., 308 nanometer wavelength) for a pulse duration of several nanoseconds.

The process can raise the temperature of layer 64 to the melting temperature of layer 64 (1100° C. for silicon germanium). The melting temperature of layer 64 in the amorphous state is significantly lower than that of substrate 14 which is in a crystalline state. For example, the melting temperature of amorphous silicon germanium is 1100° C. and the melting temperature of a single crystalline silicon substrate (C—Si) is 1400° C. Preferably, the laser fluence is controlled so that layer 64 is fully melted and substrate 14 is not melted. After the laser beam is removed, layer 64 is recrystallized as a single crystalline material. Layer 64 corresponds to silicon germanium layer 45 (channel region 41 in FIG. 1).

Figure 5:
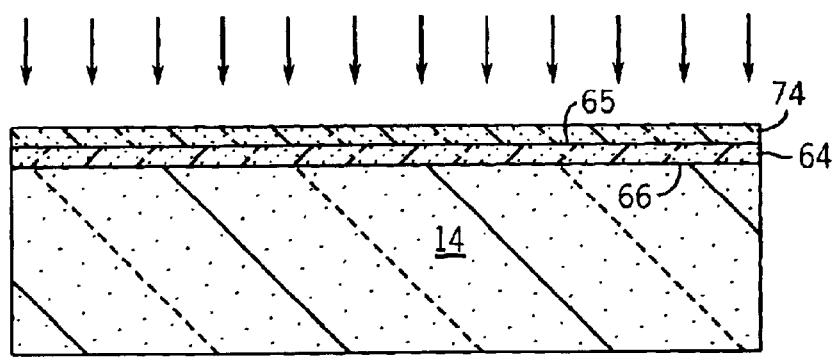
FIG. 5 is a cross-sectional view of the portion of the semiconductor substrate illustrated in FIG. 4, showing a semiconductor deposition step.

In FIG. 5, after layer 64 is recrystallized, LPCVD is utilized to provide a very thin amorphous layer 74. Layer 74 is preferably deposited at a temperature of 400–450° C. and preferably is a 100–150 Å thick amorphous silicon layer. Layer 74 is provided on a top surface 65 of layer 64.

Figure 6:
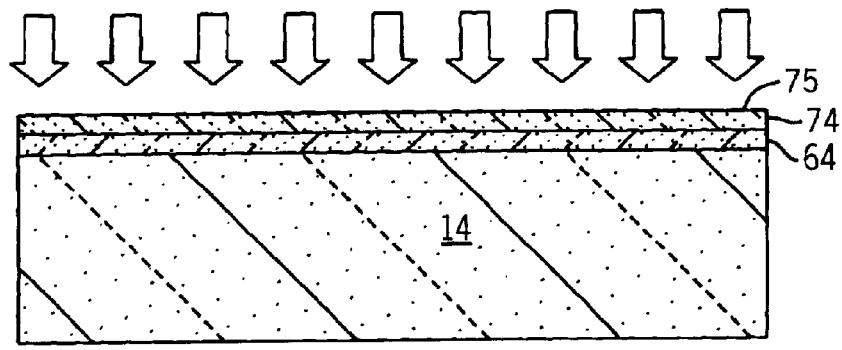
FIG. 6 is a cross-sectional view of the portion of the integrated circuit illustrated in FIG. 1, showing a laser annealing step.

In FIG. 6, after layer 74 is deposited, layer 74 is subjected to an annealing process. The annealing process changes the structure of layer 74 from an amorphous state to a single crystalline state (e.g., melts layer 74 which subsequently recrystalizes). Preferably, the annealing process is an excimer laser annealing process (e.g., 308 nanometer wavelength for a pulse duration of several nanoseconds). The annealing process can raise the temperature of layer 74 to the melting temperature of layer 74 (1100° C.). The melting temperature of layer 74 in the amorphous state is significantly lower than that of layer 64 in the single crystalline state. The melting temperature of amorphous silicon is 1100° C. and the melting temperature of single crystalline silicon-germanium is 1400° C. Preferably, the laser fluence is controlled so that layer 74 is fully melted and layer 64 is not melted. After the laser beam is removed, layer 74 is recrystallized as single crystalline material. Layer 74 advantageously serves as a cap layer above layer 64. Layer 74 corresponds to cap layer 43 (channel region 41 in FIG. 1).

In FIG. 1, transistor 12 can be substantially completed by conventional semiconductor processing techniques to include gate structure 18 and source and drain regions 22 and 24.

Gate structure 18 is comprised of layer 34 and gate conductor 36. Gate conductor 36 preferably is 800–1200 Å thick, undoped polysilicon material. Conductor 36 is preferably deposited by a chemical vapor deposition (CVD) process on top of layer 34 which is thermally grown above surface 27 (surface 75 of layer 74 in FIG. 6). Layer 34 can be thermally grown on substrate 14.

After structure 18, including layers 36 and 34 are formed, substrate 14 can be doped according to a two step doping process to form regions 22 and 24 including extensions 23 and 25. After the first doping step, spacers 38 are formed followed by a second doping step to form the deeper portions of regions 22 and 24. Preferably, the deeper portions of regions 22 and 24 are 500–1200 Å deep (e.g., 800–1000 Å below surface 27 of substrate 14). In another alternative embodiment, an amorphousizing and doping technique can be utilized to form regions 22 and 24 including extension 23 and 25.

After regions 22 and 24 are formed, a silicidation process forms silicide regions 82 within regions 22 and 24. Regions 82 can be formed by depositing a metal layer and siliciding the metal layer. Generally, sixty-percent of the thickness of the metal layer consumes substrate 14. Preferably, regions 82 extend 25 nm into substrate 14.

After regions 82 are formed, transistor 12 and integrated circuit 10 can be subjected to conventional CMOS processes to form contacts and interconnects. In addition, insulating layers can be provided over transistor 12 to otherwise complete the fabrication of portion 10.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of capping layers and semiconductor germanium layers are shown, other structures can be utilized. Various changes may be made to the details disclosed without departing from the spirit of the invention which is defined by the following claims.

What is claimed is:

1. A method of manufacturing an integrated circuit, comprising:

providing an amorphous semiconductor material including germanium above a bulk substrate of semiconductor material;

laser annealing the amorphous semiconductor material to form a single crystalline semiconductor layer containing germanium;

doping the single crystalline semiconductor layer and the substrate at a source location and a drain location to form a source region and a drain region, whereby a channel region between the source region and the drain region includes a thin semiconductor germanium region; and siliciding the source region and the drain region to form a silicide layer, the silicide layer extending into the substrate.

2. The method of claim 1 further comprising:

before the doping step, providing a cap layer above the amorphous semiconductor layer.

3. The method of claim 2 further comprising:

after the providing a cap layer step, providing a gate structure between the source location and the drain location.

4. The method of claim 3, wherein the cap layer is an amorphous semiconductor layer.

5. The method of claim 4, further comprising:

before the doping step, annealing the cap layer.

6. The method of claim 4, wherein the amorphous semiconductor layer includes silicon.

7. The method of claim 1, wherein the bulk substrate includes single crystalline silicon.

8. The method of claim 1, wherein the amorphous semiconductor material includes silicon germanium.

9. The method of claim 7, wherein the amorphous semiconductor material includes silicon germanium.

10. The method of claim 9, wherein the annealing step takes place at a temperature sufficient to melt the amorphous semiconductor layer and is below the melting temperature of the substrate.

11. The method of claim 1, further comprising:

providing a second amorphous semiconductor material above the amorphous semiconductor material including germanium after the laser annealing step;

performing another laser annealing step to form a second single crystalline semiconductive layer from the second amorphous semiconductor material; and wherein the siliciding step forms the silicide layer so that the depth of the silicided layer is deeper than the second single crystalline semiconductor layer.

12. A method of manufacturing an ultra-large scale integrated circuit including a transistor, the method comprising steps of:

depositing an amorphous silicon germanium material above a top surface of a semiconductor substrate;

first annealing the amorphous silicon germanium material;

depositing an amorphous silicon material above the silicon germanium material;

second annealing the amorphous silicon material; and providing a source region and a drain region for the transistor, the source region and the drain region being deeper than a combined thickness of the silicon germanium material and the silicon material.

13. The method of claim 12, further comprising:

providing a gate structure before providing a source region and a drain region step.

14. The method of claim 12, further comprising:

providing an oxide layer over the silicon material after the second annealing step.

15. The method of claim 12, wherein the silicon germanium material is a single crystalline layer after the first annealing step.

16. The method of claim 12, wherein the silicon material is a single crystalline layer after the second annealing step.

17. The method of claim 12, wherein the silicon material is 100–150 Å thick.

18. The method of claim 12, wherein the annealing temperature for the first and second annealing steps is at or above 1100° C. and below 1400° C.

19. A process of forming a transistor with a silicon germanium channel region, the process comprising:

depositing a thin amorphous silicon germanium material above a top surface of a semiconductor substrate;

annealing the silicon germanium material to form single crystalline silicon germanium material;

depositing a thin amorphous silicon material above the single crystalline silicon germanium material;

annealing the silicon material to form single crystalline silicon material;

providing a source region and a drain region for the transistor, the source region and the drain region extending into the substrate; and forming a conductive region in the source reunion or the drain region.

20. The process of claim 19, wherein the silicon germanium material is 200–500 Å thick.

21. The process of claim 20, wherein the silicon material is 100–150 Å thick.

22. The process of claim 19, wherein the annealing steps are excimer laser annealing steps.

23. The process of claim 22, wherein the excimer laser annealing steps use a wavelength of 308 nanometers.

24. The process of claim 23, the source and drain regions each including an extension.

25. A method of manufacturing a transistor comprising a source and drain region and a channel region, the source and drain regions being at least partially disposed in a bulk semiconductor substrate, the channel region being disposed between the source and drain regions, the channel region including a silicon germanium layer and a silicon cap layer, the method comprising:

providing an amorphous semiconductor material including germanium above a bulk substrate of semiconductor material;

providing an amorphous silicon layer above the amorphous semiconductor material;

annealing the amorphous semiconductor material and the amorphous silicon layer to form the silicon germanium layer and the silicon cap layer, the silicon germanium layer and the silicon cap layer are single crystalline;

doping the single crystalline semiconductor layer and the substrate at a source location and a drain location to form a source region and a drain region, whereby the channel region between the source region and the drain region includes at least a portion of the semiconductor germanium layer covered by the silicon cap layer; and forming a conductive region in the source region or the drain region.

26. The method of claim 25, wherein the source and drain regions are silicided in the forming step to relieve any effect of germanium in the source and drain regions.

27. The method of claim 12 further comprising:

siliciding the source and the drain region to form a silicide layer, wherein the silicide layer extends deeper than the combined thickness.

* * * * *